(12) United States Patent
Stockinger et al.

(10) Patent No.: US 7,777,575 B2
(45) Date of Patent: Aug. 17, 2010

(54) CIRCUIT WITH SINGLE-ENDED INPUT AND DIFFERENTIAL OUTPUT

(75) Inventors: Herbert Stockinger, Munich (DE); Andreas Leistner, Haar (DE)

(73) Assignee: Infineon Technologies AG, Munich (DE)

( * ) Notice: Subject to any disclaimer, the term of this patent is extended or adjusted under 35 U.S.C. 154(b) by 78 days.

(21) Appl. No.: 12/174,857

(22) Filed: Jul. 17, 2008

(65) Prior Publication Data
US 2010/0013562 A1  Jan. 21, 2010

(51) Int. Cl.
*H03F 3/45* (2006.01)
(52) U.S. Cl. ...................................... 330/301
(58) Field of Classification Search .................. 330/253, 330/301
See application file for complete search history.

(56) References Cited

U.S. PATENT DOCUMENTS

| | | | |
|---|---|---|---|
| 4,885,550 A | 12/1989 | Ferrer | |
| 5,404,050 A * | 4/1995 | Nauta | 327/100 |
| 5,945,878 A | 8/1999 | Westwick et al. | |
| 6,559,723 B2 * | 5/2003 | Hollenbeck et al. | 330/301 |
| 2002/0175763 A1 | 11/2002 | Dasgupta et al. | |

* cited by examiner

*Primary Examiner*—Steven J Mottola
(74) *Attorney, Agent, or Firm*—Eschweiler & Associates, LLC

(57) ABSTRACT

An inverting stage is coupled between a single-ended in-put node and a first differential output node, and a non-inverting stage is coupled between the single-ended input node and a second differential output node. The inverting stage includes at least one transistor with a first current terminal, a second current terminal, and a control terminal, the first current terminal being coupled to the first differential output node and the control terminal being coupled to a single-ended input node. The non-inverting stage includes at least one transistor with a first current terminal, a second current terminal, and a control terminal, the first current terminal being coupled to the second differential output node, and the second terminal being coupled to the single-ended input node. A bias current of the inverting stage is larger than a bias current of the non-inverting stage.

22 Claims, 6 Drawing Sheets

CIRCUIT WITH SINGLE-ENDED INPUT AND DIFFERENTIAL OUTPUT

FIELD

The present invention relates to integrated circuits, methods and electronic devices which allow for converting single-ended signals to differential signals.

BACKGROUND

In the field of signal processing, it is known to convert single-ended signals to differential signals. This may be accompanied by an amplification of the signals. Further, for some applications, also power matching of the single-ended input is desirable.

Accordingly, there is a need to provide improved techniques for converting a single-ended signal to a differential signal.

SUMMARY

According to one embodiment of the invention, a circuit is provided which comprises a single-ended input node, a first differential output node, and a second differential output node. Further, the circuit comprises an inverting stage coupled between the single-ended input node and the first differential output node, and a non-inverting stage coupled between the single-ended input node and the second differential output node. The inverting stage comprises at least one transistor with a first current terminal, a second current terminal and a control terminal. The first current terminal of the at least one transistor of the inverting stage is coupled to the first differential output node, and the control terminal of the at least one transistor of the inverting stage is coupled to the single-ended input node. The non-inverting stage comprises at least one transistor with a first current terminal, a second current terminal, and a control terminal. The first current terminal of the transistor of the non-inverting stage is coupled to the second differential output node, and the second current terminal of the non-inverting stage being coupled to the single-ended input node. In the circuit, a bias current of the inverting stage is larger than a bias current of the non-inverting stage.

DETAILED DESCRIPTION

The following detailed description explains exemplary embodiments of the present invention. The description is not to be taken in a limiting sense, but is made only for the purpose of illustrating the general principles of the invention. It is to be understood that the scope of the invention is only defined by the claims and is not intended to be limited by the exemplary embodiments described hereinafter. Further, it is to be understood that in the following detailed description of exemplary embodiments any shown or described direct connection or coupling between two functional blocks, devices, components or other physical or functional units could also be implemented by indirect connection or coupling.

In the following, embodiments of the invention will be described with reference to the accompanying drawings. The embodiments described hereinafter relate to integrated circuits which implement a single-ended to differential conversion and to electronic devices using at least one of such integrated circuits. For example, the electronic devices may be receiver devices, such as television or radio receivers, in which a high-frequency signal, such as an antenna signal, is processed. However, it is to be understood that the described concepts of single-ended to differential conversion may also be used in other applications and other types of electronic devices.

Figure 1:
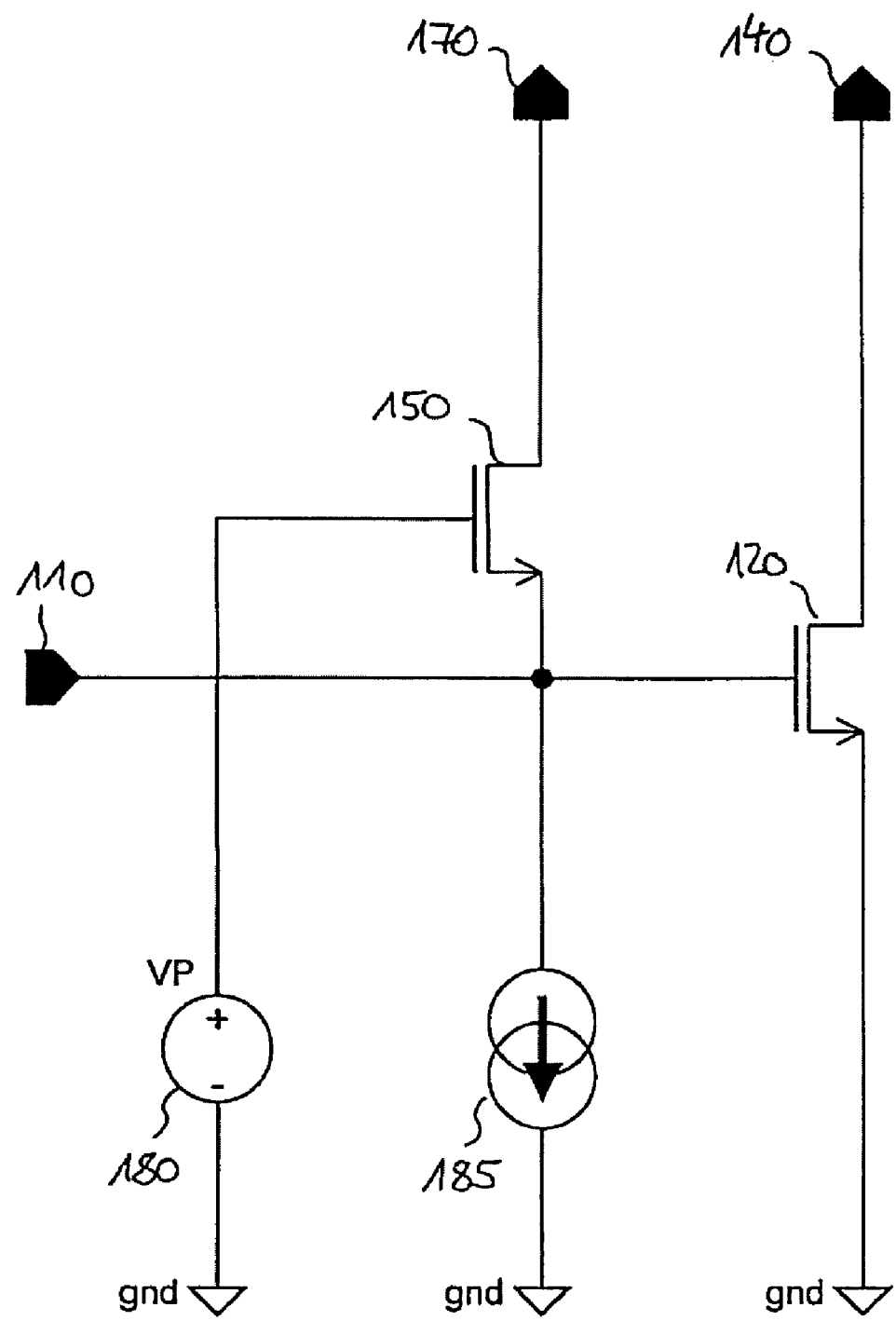
FIG. 1 schematically illustrates an integrated circuit according to an embodiment of the invention.

FIG. 1 schematically illustrates a circuit structure comprised in an integrated circuit. The circuit structure is configured to accomplish single-ended to differential conversion of a signal. As illustrated, the circuit structure comprises a single-ended input node 110, a first differential output node 140, and a second differential output node 170. In combination, the first differential output node 140 and the second differential output node 170 form a differential output. According to an embodiment, the single-ended input node 110, the first differential output node 140, and the second differential output node 170 may correspond to external terminals of the integrated circuit. In other embodiments the single-ended input node 110, the first differential node 140, and the second differential output node 170 may be internal circuit nodes of the integrated circuit. According to further embodiments, it is also possible to have a combination of external terminals and internal circuit nodes. For example, the single-ended input node 110 may correspond to an external terminal of the integrated circuit, and the first differential output node 140 and the second differential output node 170 may correspond to internal circuit nodes of the integrated circuit, or the single-ended input node 110 may be an internal circuit node of the integrated circuit, and the first differential output node 140 and the second differential output node 170 may correspond to external terminals of the integrated circuit.

Due to its function, the circuit structure as shown in FIG. 1 may also be referred to as a single-ended to differential converter.

For the purpose of single-ended to differential conversion, the circuit structure comprises an inverting stage coupled between the single-ended input node 110 and the first differential output node 140. The inverting stage comprises a transistor 120 which has a control terminal coupled to the single-ended input node 110 and has a first current terminal coupled to the first differential output node 140. A second current terminal of the transistor 120 is coupled to a first circuit potential, in the illustrated example ground (in the figure denoted by "gnd").

In the illustrated example, the transistor 120 is a field-effect transistor of NMOS type. Accordingly, the first current terminal or current input terminal corresponds to a drain terminal, the second current terminal or current output terminal corresponds to a source terminal, and the control terminal corresponds a gate terminal. The transistor 120 is connected in a common-source configuration.

Further, the circuit structure comprises a non-inverting stage coupled between the single-ended input node 110 and the second differential output node 170. The non-inverting stage comprises a transistor 150. A first current terminal of the transistor 150 is coupled to the second differential output node 170, and a second current terminal of the transistor 150 is coupled to the single-ended input node 110. A control terminal of the transistor 150 is coupled to a bias voltage source 180 which provides a bias voltage VP with respect to the first circuit potential. The second current terminal of the transistor 150 is further coupled to a bias current source 185 which provides a bias current flowing through the non-inverting stage from the second differential output node 170, through the first and second current terminals of the transistor 150, to the first circuit potential.

In the illustrated example, the transistor 150 is a field-effect transistor of NMOS type. Accordingly, the first current terminal or current input terminal of the transistor 150 corresponds to a drain terminal, the second current terminal or current output terminal of the transistor corresponds to a source terminal, and the control terminal of the transistor 150 corresponds to a gate terminal. As can be seen, the transistor 150 is connected in a common-gate configuration.

Due to the above-mentioned configurations of the transistor 120 in the inverting stage and the transistor 150 in the non-inverting stage, the inverting stage may also be referred to as a common-source stage, and the non-inverting stage may also be referred to as a common-gate stage.

As the input of the inverting stage corresponds to the control terminal of the transistor 120, the inverting stage has a high input impedance. As the input of the non-inverting stage corresponds to a current terminal of the transistor 150, power matching of the input of the non-inverting stage is possible.

When a signal is applied to the single-ended input node 110, it is converted into a corresponding differential output signal which can be tapped at the first differential output node 140 and the second differential output node 170. In the example as illustrated in FIG. 1, the differential output signal is a differential output current.

It is to be understood that in the illustrated embodiment the inverting stage and the non-inverting stage correspond to amplifier stages and that the amplification of the inverting stage and the non-inverting stage can be set according to the intended application. According to some embodiments, an amplification factor of the differential output current with respect to a single-ended input current may be one. According to other embodiments, the amplification factor may be smaller than one.

In the circuit structure as illustrated in FIG. 1, the bias current of the non-inverting stage is provided by the bias current source 185. A bias current of the inverting stage, i.e. a current flowing through the inverting stage from the first differential output node 140, through the first and second current terminals of the transistor 120, to the first circuit potential, can be controlled by setting the bias voltage VP applied to the control terminal of the transistor 150 and thus the potential at the control terminal of the transistor 120. In the illustrated example, a bias circuit for setting the bias current of the inverting stage and of the non-inverting state is thus formed by the bias voltage source 180, the bias current source 185, and the coupling between the inverting stage and the non-inverting stage.

According to the illustrated embodiment, the transistor 120 and the transistor 150 are operated in the linear regime, significantly below gain compression, and the bias current of the inverting stage is set to be larger than the bias current of the non-inverting stage. According to some embodiments, the increased bias current of the inverting stage may be used to improve the intermodulation strength of the single-ended to differential converter. For this purpose, a transistor channel length L of the transistor 120 may be selected different from, e.g. larger than, a transistor channel length L of the transistor 150. Further, a transistor channel width W of the transistor 120 may be selected different from, e.g. larger than, a transistor channel width W of the transistor 150. Generally, the transistor channel length L and the transistor width W of the transistor 120 are selected so as to have a ratio L/W which is larger than the ratio L/W of the transistor 150. According to further embodiments, the increased bias current of the inverting stage can be used to improve noise characteristics of the single-ended to differential converter.

According to an embodiment, a transistor geometry of the transistor 120 and a transistor geometry of the transistor 150 may be adjusted so as to compensate for transconductance variations between the inverting stage and the non-inverting stage due to the body effect or Early effect. For example, this may be accomplished by reducing the transistor channel length of the transistor 120 relative to the transistor channel length of the transistor 150 or by increasing the transistor channel width of the transistor 120 relative to the transistor channel width of the transistor 150. According to an embodiment, the transconductance of the inverting stage and the transconductance of the non-inverting stage are substantially equal.

Figure 2:
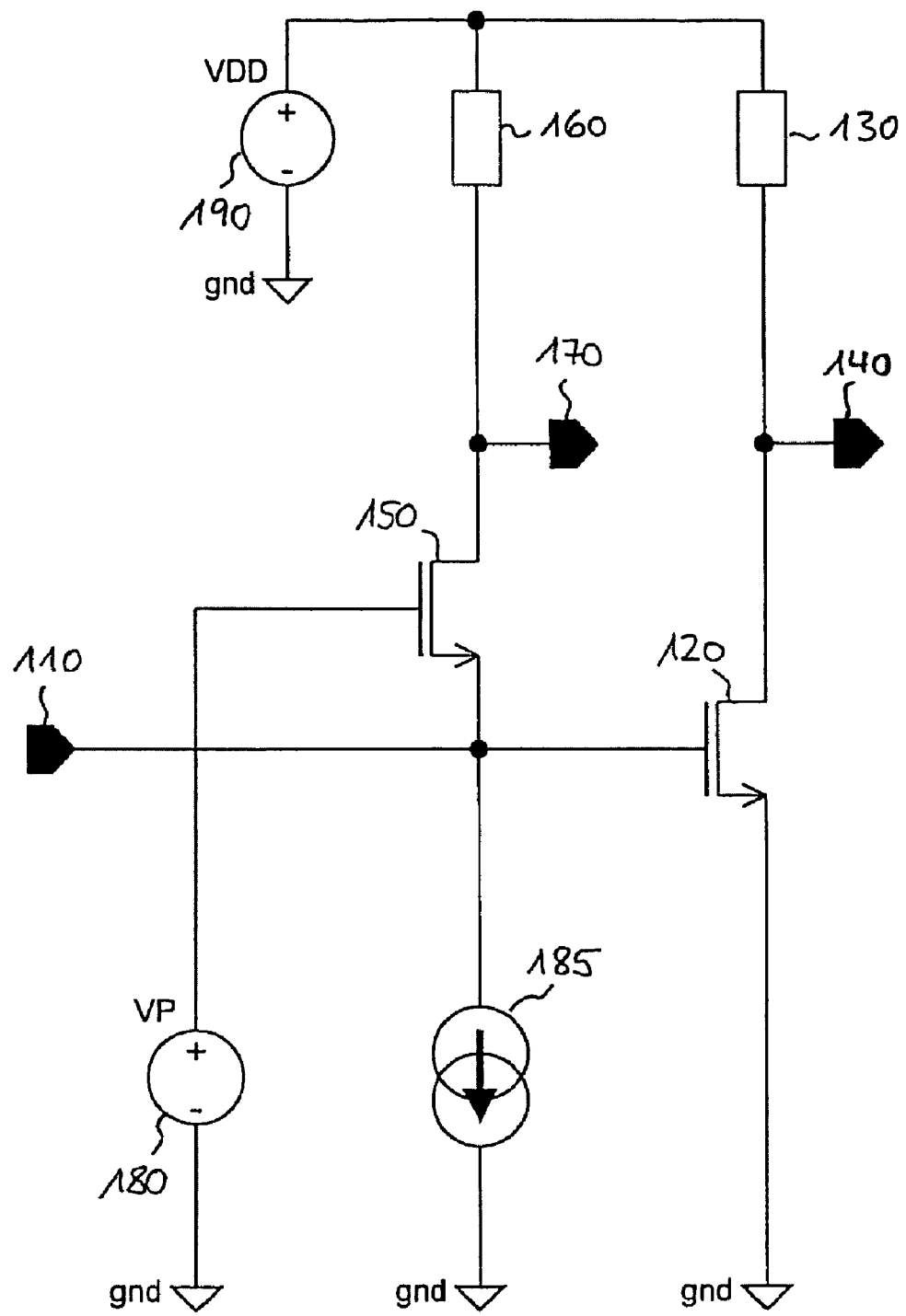
FIG. 2 schematically illustrates an integrated circuit according to a further embodiment of the invention.

FIG. 2 schematically illustrates a circuit structure for single-ended to differential conversion in an integrated circuit according to a further embodiment of the invention. The circuit structure of FIG. 2 generally corresponds to that of FIG. 1 and similar components have been designated with the same reference signs. In the following, only the differences as compared to the circuit structure of FIG. 1 will be explained.

In the circuit structure of FIG. 2, the inverting stage further comprises a resistor 130 coupled between the first differential output node 140 and a second circuit potential, in the illustrated example a high supply voltage VDD provided by a supply voltage source 190. Further, the non-inverting stage comprises a resistor 160 coupled between the second differential output node 170 and the second circuit potential.

The purpose of the resistors 130, 160 is to convert the differential output current into a differential output voltage. Accordingly, in the circuit structure of FIG. 2, a differential output voltage can be tapped at the first and second differential output nodes 140, 170.

According to some embodiments, the resistance values of the resistors 130, 160 are set to be substantially equal, e.g. to a value of about 100 Ω. In other embodiments, the resistance value of the resistor 130 is selected to be smaller than the resistance value of the resistor 160. In connection with the increased bias current of the inverting stage this allows for a noise reduction in the differential output signal. At the same time, the transistor channel width of the transistor 120 may be increased relative to the transistor channel width of the transistor 150 so as to obtain the same voltage amplification factor for the inverting stage and for the non-inverting stage.

Figure 3:
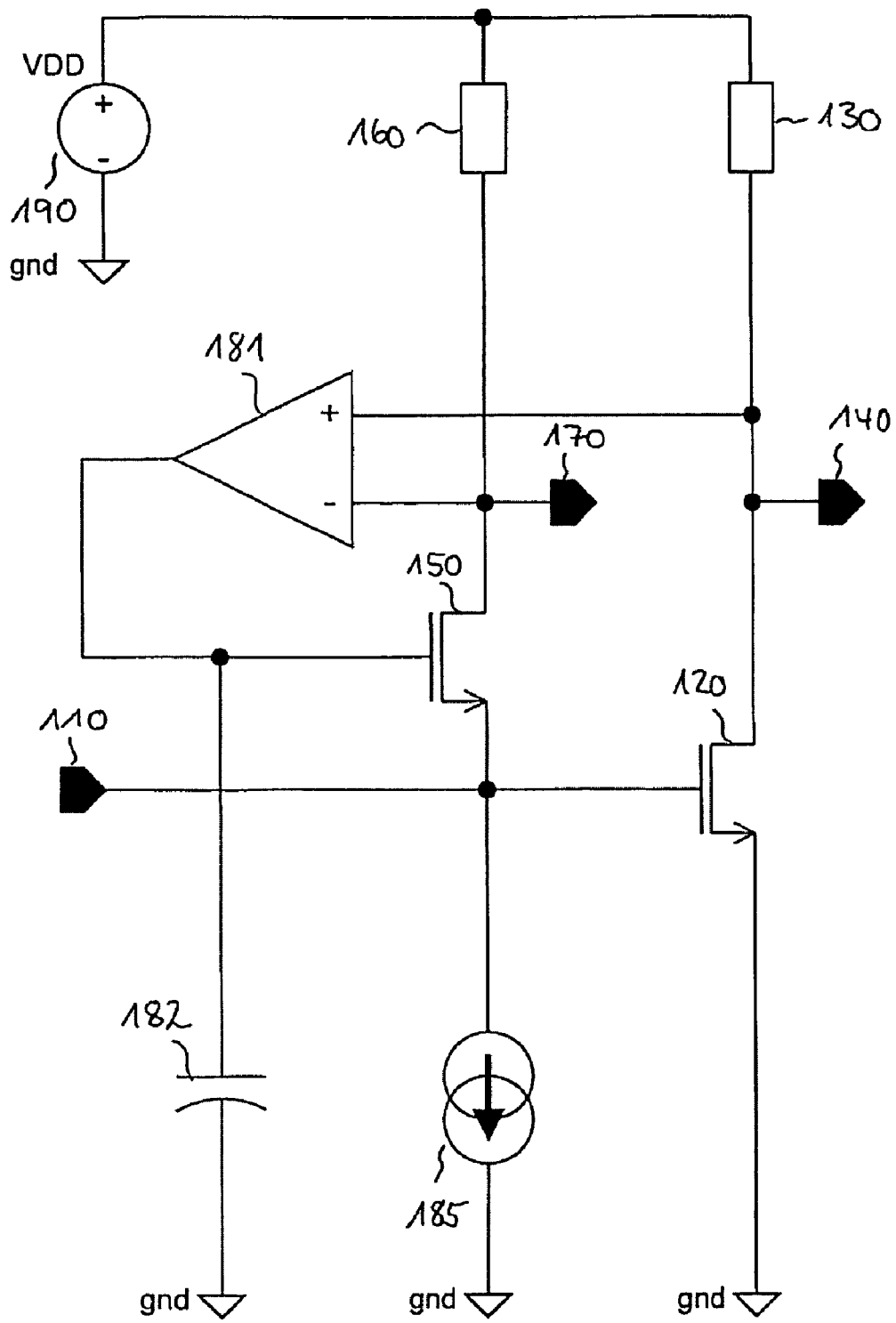
FIG. 3 schematically illustrates an integrated circuit according to a further embodiment of the invention.

FIG. 3 schematically illustrates a circuit structure for single-ended to differential conversion in an integrated circuit according to a further embodiment of the invention. The circuit structure generally corresponds to that as illustrated in FIG. 2 and similar components have been designated with the same reference signs. In the following, only the differences as compared to the circuit structure of FIG. 2 will be explained.

As illustrated, in the circuit structure of FIG. 3, the bias voltage source is implemented by means of an operational amplifier 181. The operational amplifier 181 has a non-inverting differential input coupled to the inverting stage and an inverting differential input coupled to the non-inverting stage. A single-ended output of the operational amplifier 181 is coupled to the control terminal of the transistor 150. Further, a capacitor 182 is coupled between the single-ended output of the operational amplifier 181 and the first circuit potential.

The operational amplifier 181 controls the voltage applied to the control terminal of the transistor 150 in such a way that the voltage difference at the differential input of the operational amplifier 181 is substantially zero. According to an embodiment, the operational amplifier 181 is an operational transconductance amplifier.

In the illustrated example, the inverting differential input of the operational amplifier 181 is coupled to the non-inverting stage so as to receive substantially the same potential as present at the second differential output node 170. The non-inverting differential input of the operational amplifier 181 is coupled to the inverting stage so as to receive substantially the same potential as present at the first differential output node 140. In order to account for the different bias currents in the inverting stage and in the non-inverting stage, the resistor 130 may be provided with a smaller resistance value than the resistor 160.

By means of the capacitor 182, feedback of AC-components of the differential output signal at the first and second differential output nodes 140, 170 to the control terminal of the transistor 150 is avoided and noise from the operational amplifier 181 is filtered out.

Figure 4:
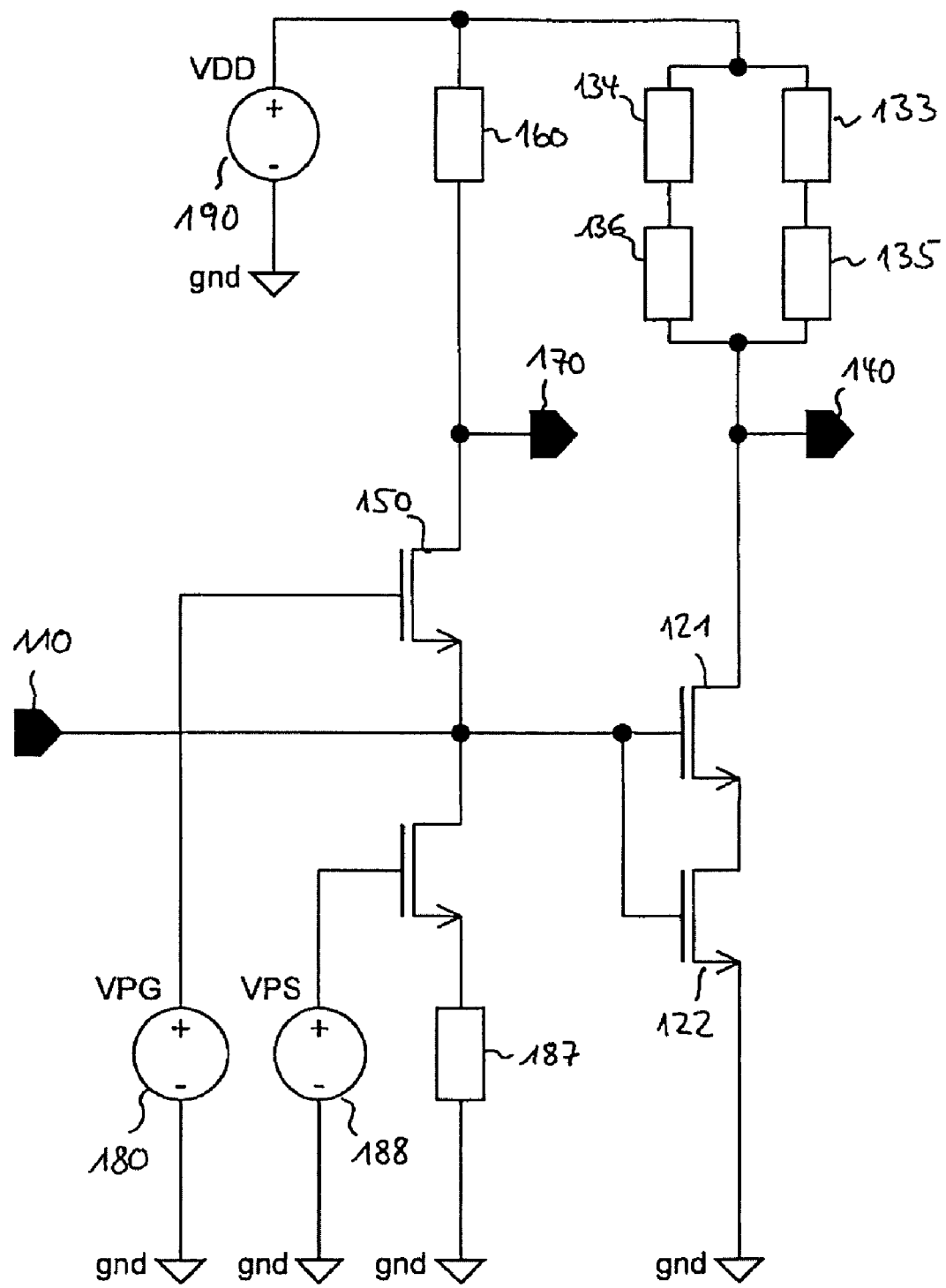
FIG. 4 schematically illustrates an integrated circuit according to a further embodiment of the invention.

FIG. 4 schematically illustrates a circuit structure for single-ended to differential conversion in an integrated circuit according to a further embodiment of the invention. The circuit structure generally corresponds to that as illustrated in FIG. 2 and similar components have been designated with the same reference signs. In the following, only the differences as compared to the circuit structure of FIG. 2 will be explained.

The circuit structure of FIG. 4 shows one exemplary way to implement the inverting stage with a different transistor channel length than the non-inverting stage. Further, the circuit structure of FIG. 4 shows a specific implementation of the bias current source coupled to the second current terminal of the transistor 150.

As shown in FIG. 4, the inverting stage comprises a series connection of transistors 121, 122. The transistors 121, 122 are connected in series via their first and second current terminals. A first current terminal of the transistor 121 is coupled to the first differential output node 140, and a second current terminal of the transistor 121 is coupled to a first current terminal of the transistor 122. A second current terminal of the transistor 122 is coupled to the first circuit potential. The control terminals of the transistors 121, 122 are both coupled to the single-ended input node 110. Accordingly, the operation of the transistors 121, 122 is similar to that of a single transistor having a transistor channel length corresponding to the sum of the individual transistor channel lengths of the transistors 121, 122.

The transistors 121, 122 are field-effect transistors of NMOS type. Accordingly, the first current terminal or current input terminal of the transistors 121, 122 corresponds to a drain terminal, the second current terminal or current output terminal of the transistors 121, 122 corresponds to a source terminal, and the control terminal of the transistors 121, 122 corresponds to gate terminals. The transistors 121, 122 may also be regarded as a single transistor connected in common-source configuration.

As further illustrated, the bias current source is implemented by a transistor 186 coupled with a first current terminal to the second current terminal of the transistor 150. A second current terminal of the transistor 186 is coupled to the first circuit potential via a resistor 187. The control terminal of the transistor 186 is coupled to a bias voltage source 188 which provides a bias voltage VPS with respect to the first circuit potential. In the illustrated example, the transistor 186 is a field-effect transistor of NMOS type. Accordingly, the first current terminal or current input terminal corresponds to a drain terminal, the second current terminal or current output terminal corresponds to a source terminal, and the control terminal corresponds to a gate terminal.

In the circuit structure of FIG. 4, the bias current of the non-inverting stage can be set using the bias voltage source 188 and by suitably dimensioning the resistor 187.

As further illustrated, the first differential output node 140 is coupled to the second circuit potential via resistors 133, 134, 135, 136. The resistors 133 and 135 are connected in series, and the resistors 134 and 136 are connected in series. The series connections of the resistors 133, 135 and the series connection of the resistors 134, 136 are connected in parallel between the first differential output node 140 and the second circuit potential. It is to be understood, that the resistors 133, 134, 135, 136 can also be regarded as a single resistor having a resistance combined of the individual resistances of the resistors 133, 134, 135, 136.

According to an embodiment, parameters of the circuit structure as illustrated in FIG. 4 are dimensioned as follows so as to obtain an improved intermodulation strength of the single-ended to differential converter: The transistors 121, 122, 150 are substantially equal. That is to say, the transistors 121, 122, 150 are of the same type and have substantially the same dimensioning. According to an embodiment, the dimensioning of the transistors 121, 122, e.g. the transistor channel areas, may be modified relative to the dimensioning of the transistor 150 in order to compensate for transconductance variations between the inverting and the non-inverting stage due to the body effect or Early effect. The resistors 133, 134, 135, 136, 160 have the same resistance values, e.g. of a about 100 Ω. This means that the combined resistance value of the resistors 133, 134, 135, 136 corresponds to the resistance value of the resistor 160. The bias voltage VP and the bias voltage VPS are set in such a way that the bias current of the inverting stage is twice the bias current of the non-inverting stage.

In the above example, the bias current of the inverting stage is twice the bias current of the non-inverting stage, and the transistor channel length of the inverting stage, i.e. the combined transistor channel lengths of the transistors 121, 122, is twice the transistor channel length of the non-inverting stage, i.e. the transistor channel length of the transistor 150. Accordingly, the transconductance and the voltage amplification factor of the inverting stage are substantially the same as the transconductance and the voltage amplification factor of the non-inverting stage. Due to the increased bias current in the inverting stage, the intermodulation strength of the single-ended to differential converter is improved. Specifically, the second- and third-order intercept points (also referred to as IP2 and IP3) of the inverting stage are improved.

It is to be understood, that the concepts as described in connection with FIG. 4 can easily be generalized to arbitrary numbers of transistors connected in series, either in the inverting stage or in the non-inverting stage. That is to say, the transistors 121, 122 could be replaced by a different number of series-connected transistors, including only one transistor, and the transistor 150 could be replaced by a series connection of two or more transistors. When using transistors which are substantially equal, this allows for accurately setting the transistor channel length of the inverting stage with respect to the transistor channel length of the non-inverting stage. For example, the ratio of the transistor channel length of the inverting stage to the transistor channel length of the non-inverting stage can be set a desired natural number or to a desired rational number.

Figure 5:
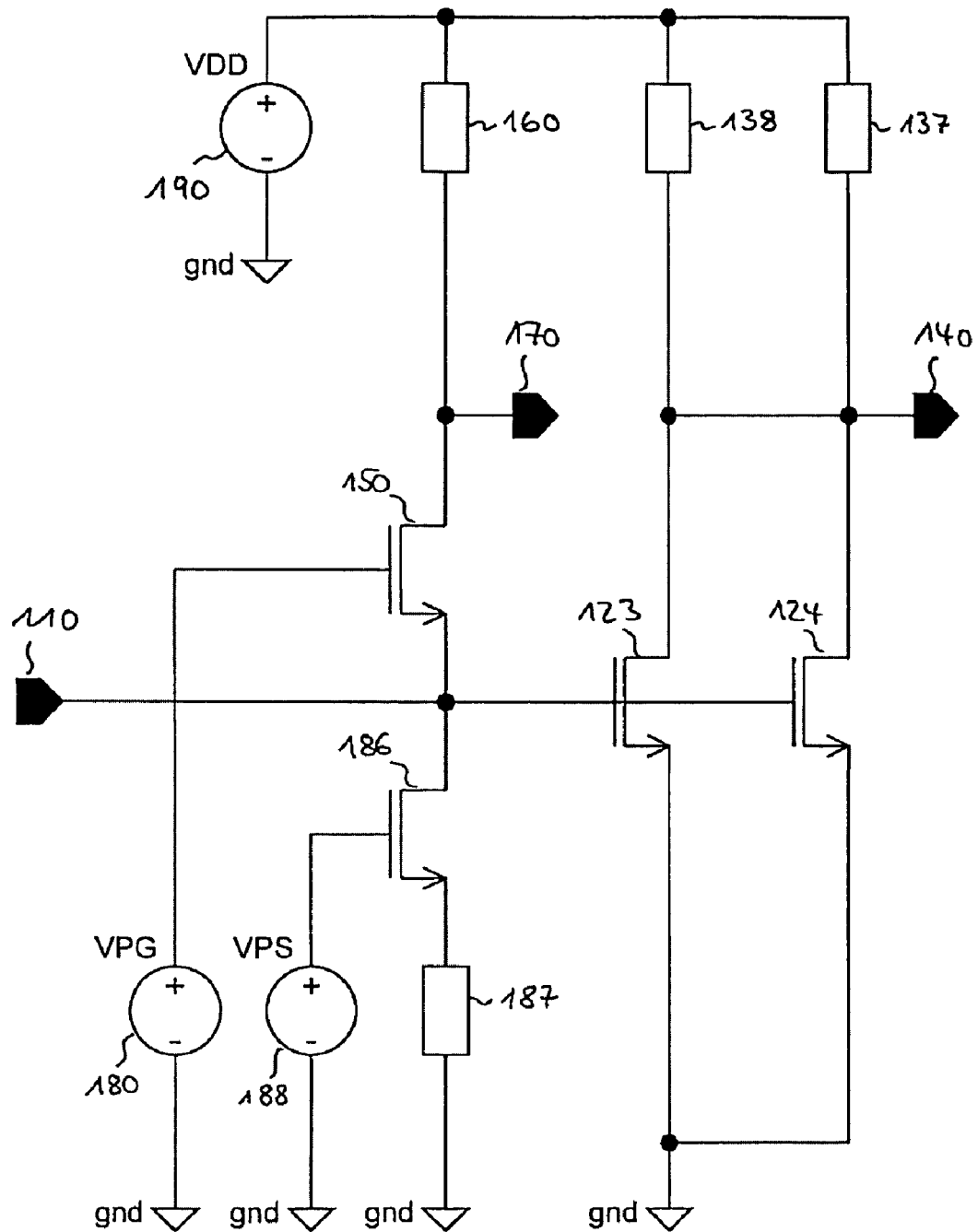
FIG. 5 schematically illustrates an integrated circuit according to a further embodiment of the invention.

FIG. 5 schematically illustrates a circuit structure for single-ended to differential conversion in an integrated circuit according to a further embodiment of the invention. The circuit structure of FIG. 5 generally corresponds to that of FIG. 4 and similar components have been designated with the same reference signs. In the following, only the differences as compared to the circuit structure of FIG. 4 will be explained.

As illustrated, in the circuit structure of FIG. 5 the inverting stage comprises transistors 123, 124 which are connected in parallel. In particular, the transistor 123 has a first current terminal coupled to the first differential output node 140, a second current terminal coupled to the first circuit potential, and a control terminal coupled to the single-ended input node 110. The transistor 124 has a first current terminal coupled to the first differential output node 140, a second current terminal coupled to the first circuit potential, and a control terminal coupled to the single-ended input node 110. Accordingly, the transistors 123, 124 may also be regarded as a single transistor having a combined transistor channel width which substantially corresponds to the sum of the individual transistor channel widths of the transistors 123, 124. In the illustrated example, the transistors 123, 124 are field-effect transistors of NMOS type. Accordingly, the first current terminal or current input terminal of the transistors 123, 124 corresponds to a drain terminal, the second current terminal or current output terminal of the transistors 123, 124 corresponds to a source terminal, and the control terminal of the transistors 123, 124 corresponds to a gate terminal.

As further illustrated, the first differential output node 140 is coupled to the second circuit potential via resistors 137, 138 which are connected in parallel. It is to be understood, that the resistors 137, 138 may be regarded as a single resistor having a resistance value combined from the individual resistance values of the resistors 137, 138.

According to an embodiment, parameters of the circuit structure as illustrated in FIG. 5 are dimensioned as follows so as to obtain improved noise-characteristics of the single-ended to differential converter: The transistors 123, 124, 150 are substantially equal, i.e. of the same type and of substantially the same dimensioning. According to an embodiment, the dimensioning of the transistors 123, 124, e.g. the transistor areas, may be modified relative to the dimensioning of the transistor 150 in order to compensate for transconductance variations between the inverting stage and the non-inverting stage due to the body effect or Early effect. The resistors 137, 138, 160 are selected to have substantially equal resistance values. In the circuit structure as illustrated in FIG. 5, this means that the first differential output node 140 is coupled to the second circuit potential via a resistor which has half the resistance value of the resistor 160 coupling the second differential output 170 to the second circuit potential. The bias voltages VP and VPS are set in such a way that the bias current of the inverting stage, i.e. the current flowing from the second circuit potential, through the components of the inverting stage, to the first circuit potential, is twice the bias current of the non-inverting stage, i.e. the current flowing from the second circuit potential, through the components of the non-inverting stage, to the first circuit potential. Accordingly, noise in the differential output signal can be reduced as the inverting stage is operated with an increased transconductance but with a lower load resistance.

Figure 6:
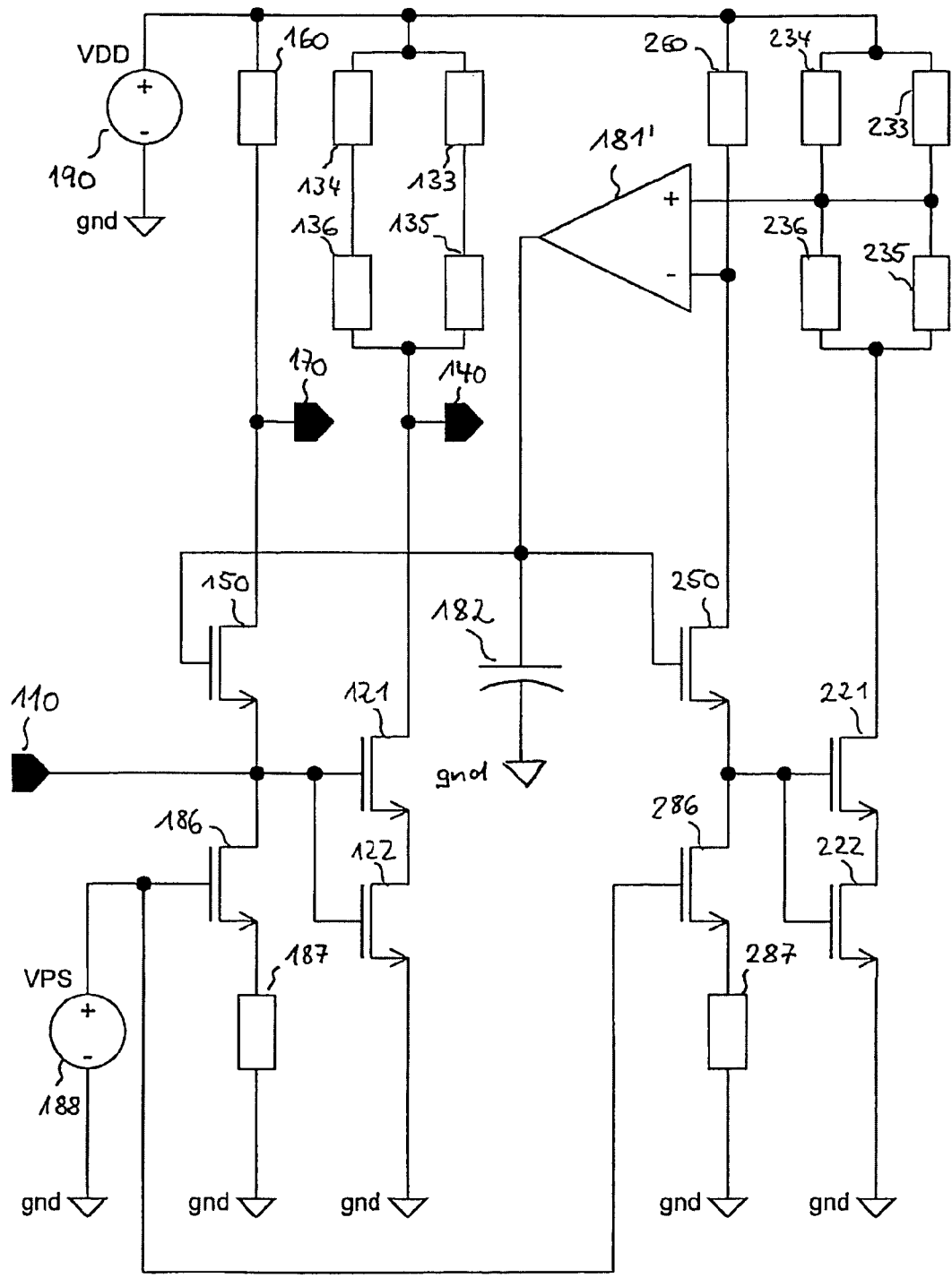
FIG. 6 schematically illustrates an integrated circuit according to a further embodiment of the invention.

FIG. 6 schematically illustrates a circuit structure for single-ended to differential conversion in an integrated circuit according to a further embodiment of the invention. The circuit structure generally corresponds to that of FIG. 4 and similar components have been designated with the same reference signs. In the following, only the differences as compared to the circuit structure of FIG. 4 will be explained.

As illustrated, the circuit structure of FIG. 6 comprises replica circuits of the inverting stage and of the non-inverting stage and an operational amplifier 181' for generating the bias voltage applied to the control terminal of the transistor 150 in the non-inverting stage.

The replica circuit of the inverting stage comprises transistors 221, 222 which are similar to the transistors 121, 122 of the inverting stage. The transistors 221, 222 are coupled in series, the transistor 221 having a current terminal coupled via resistors 233, 234, 235, 236 to the second circuit potential, and a second current terminal coupled to a first current terminal of the transistor 222. The transistor 222 has a second current terminal coupled to the first circuit potential. The resistors 233, 235 are connected in series, and the resistors 234, 236 are connected in series. The series connection of the resistors 233, 235 is connected in parallel to the series connection of the resistors 234, 236. The replica circuit of the non-inverting stage comprises a transistor 250 which is similar to the transistor 150 of the non-inverting stage. The transistor 250 has a first current terminal coupled to the second circuit potential via a resistor 260 and a second current terminal coupled to the first current terminal of a transistor 286 which is similar to the transistor 186 of the bias current source. The transistor 286 has a second current terminal coupled to the first circuit potential via a resistor 287, the resistor 287 being similar to the resistor 187 of the bias current source. The control terminal of the transistor 286 is coupled to the bias voltage source 188 so as to receive the same bias voltage VPS with respect to the first circuit potential. Accordingly, the transistor 286 and the resistor 287 form a replica of the bias current source.

The control terminals of the transistors 221, 222 are coupled to a circuit node between the second current terminal of the transistor 250 and the first current terminal of the transistor 286, which is similar to the coupling between the inverting stage and the non-inverting stage formed between the control terminals of the transistors 121, 122 with respect to a circuit node between the second current terminal of the transistor 150 and the first current terminal of the transistor 186. However, as compared to the inverting stage and the non-inverting stage, the replica circuits of the inverting stage and the non-inverting stage of the second current terminal of the transistor 250 and the control terminals of the transistors 221, 222 are not coupled to the single-ended input node 110. In this way, circuit potentials in the replica circuits of the inverting stage and of the non-inverting stage can be used for bias-voltage generation without disturbances from a high-frequency signal applied to the single-ended input node 110.

According to the illustrated embodiment, the transistors 221, 222, 250, 286 of the replica circuits are field-effect transistors of NMOS type, similar as the transistors 121, 122, 150, 186. The first current terminal or current input terminal of these transistors thus corresponds to a drain terminal, the second current terminal or current output terminal of these transistors thus corresponds to a source terminal, and the control terminal of these transistors thus corresponds to a gate terminal.

For generating the bias voltage applied to the control terminals of the transistors 150, 250, the structure of FIG. 6 comprises an operational amplifier 181' coupled between the replica circuits of the inverting stage and of the non-inverting stage and the control terminals of the transistors 150, 250. In the illustrated example, the operational amplifier 181' comprises a non-inverting differential input which is coupled to circuit nodes between the resistors 233, 234 and the resistors 235, 236, and an inverting differential input coupled to the circuit node between the resistor 260 and the first current terminal of the transistor 250. A single-ended output of the operational amplifier 181' is coupled to the control terminals of the transistors 150, 250. Further, a capacitor 182 is coupled between the single-ended output of the operational amplifier 181' and the first circuit potential. The operational amplifier 181' operates to control the voltage at its single-ended output terminal in such a way that the voltage difference at its differential input is controlled to zero. According to an embodiment, the operational amplifier 181' is an operational transconductance amplifier.

According to an embodiment, the resistors 233, 234, 235, 236, 260 have substantially the same dimensioning, i.e. have substantially the same resistance values. Accordingly, the voltage applied to the non-inverting input of the operational amplifier 181' will be the same as the voltage applied to the inverting differential input of the operational amplifier 181' if a bias current flowing from the second circuit potential through the replica circuit of the inverting stage to the first circuit potential is twice a bias current flowing from the first circuit potential through the replica circuit of the non-inverting stage to the first circuit potential. The bias current of the inverting stage and the bias current of the non-inverting stage will be adjusted in a corresponding manner. Accordingly, the ratio of the bias current of the inverting stage with respect to the bias current of the non-inverting stage can be set by suitably dimensioning and selecting the resistors 133, 134, 135, 136, 160, 233, 234, 235, 236, 260.

As mentioned above, the components of the replica circuits of the inverting stage and of the non-inverting stage may have the same dimensioning as the corresponding components of the inverting stage and of the non-inverting stage. However, according to some embodiments it is also possible that the replica circuits are scaled with respect to the inverting stage and the non-inverting stage. This means that the components of the replica circuits may have a larger or smaller dimensioning with respect to the corresponding components of the inverting stage and of the non-inverting stage, as long as the relative dimensioning of the components in the replica circuits is the same as the relative dimensioning of the components in the inverting stage and in the non-inverting stage. Smaller dimensioning of the replica circuits reduces current consumption in the bias circuit.

In the exemplary circuit structure of FIG. 6, the inverting stage and the non-inverting stage may be modified as explained in connection with FIG. 4. For example, series connections of more than two transistors may be formed in the inverting stage, or a series connection of two or more transistors may be formed in the non-inverting stage so as to obtain different transistor channel lengths of the inverting stage and of the non-inverting stage. In such embodiments, the replica circuits of the inverting stage and of the non-inverting stage would be modified in a corresponding manner.

Further, it is to be understood that the concepts of generating the bias voltage applied to the control terminal of the transistor 150 as explained in connection with the exemplary circuit structure of FIG. 6 could also be applied to the circuit structure of FIG. 5, in which the inverting stage comprises parallel-connected transistors so as to obtain a larger transistor channel width. In such embodiments, the replica circuits of the inverting stage and of the non-inverting stage would be provided with parallel-connected transistors as well.

In the following dimensioning examples using an increased bias current in the inverting stage will be explained.

These examples can be implemented on the basis of the above-described exemplary circuit structures and involve varying the transistor channel width, e.g. gate width, or the transistor channel length, e.g. gate length. Further, when using a voltage output, the load resistance in the inverting stage can be varied with respect to the non-inverting stage. In the following discussions, the bias current in the inverting stage is denoted by Ii, the transistor channel width in the inverting stage is denoted by Wi, the transistor channel length in the inverting stage is denoted by Li, and the load resistance in the inverting stage is denoted by Ri. The bias current in the non-inverting stage is denoted by In, the transistor channel width in the non-inverting stage is denoted by Wn, the transistor channel length in the non-inverting stage is denoted by Ln, and the load resistance in the non-inverting stage is denoted by Rn.

In the following examples, parameters of the inverting stage and of the non-inverting stage are dimensioned so as to obtain a substantially symmetrical differential output signal. For this purpose, in case of using a differential current output, the transconductance in the inverting stage and in the non-inverting stage are substantially equal. When using a differential voltage output, the voltage amplification factors of the inverting stage and of the non-inverting stage are substantially equal. The examples are based on a quadratic model of MOS transistors operated in saturation region.

In each of the following examples, the bias current of the inverting stage is larger than the bias current of the non-inverting stage by a factor k>1:

$Ii=k·In$.

According to a first example, the transistor channel width of the inverting stage is increased by the same factor k with respect to the transistor channel width of the non-inverting stage:

$Wi=k·Wn$.

In the first example, the transistor channel length of the inverting stage is the same as the transistor channel length of the non-inverting stage:

$Li=Ln$.

Further, the load resistance of the inverting stage is smaller than the load resistance of the non-inverting stage by the factor k:

$Ri=Rn/k$.

According to the first example, the noise characteristics of the differential output signal are improved. The differential output voltage is substantially symmetrical around zero, i.e. there is no DC offset.

According to a second example, the transistor channel length of the inverting stage is larger than the transistor channel length of the non-inverting stage by the factor k:

$Li=k·Ln$.

According to the second example, the transistor channel width of the inverting stage is the same as the transistor channel width of the non-inverting stage:

$Wi=Wn$.

Further, if optionally a load resistor is used for generating a differential output voltage, the load resistance of the inverting stage is the same as the load resistance of the non-inverting stage:

$Ri=Rn$.

According to a third example, the transistor channel width of the inverting stage is larger than the transistor channel width of the non-inverting stage by the factor k:

$$Wi = k \cdot Wn.$$

In addition, the transistor channel length of the inverting stage is larger than the transistor channel length of the non-inverting stage by a factor $k^2$:

$$Li = k^2 \cdot Ln.$$

If optionally a load resistor is used for generating a differential output voltage, the load resistance of the inverting stage is the same as the load resistance of the non-inverting stage:

$$Ri = Rn.$$

According to the second and third example, the intermodulation strength of the single-ended to differential converter is improved. The differential output current and differential output voltage is substantially symmetrical. In the first and third example, the dimensioning was chosen in such a way that a bias current through each individual transistor has the same value.

In the above examples, the transistor channel width may be varied by using parallel connected transistors. For example, if k is a natural number, the non-inverting stage may comprise one transistor, and the inverting stage may comprise k parallel-connected transistors of the same type and of substantially the same dimensioning. According to a further example, k may be a rational number, and parallel-connected transistors of the same type and substantially the same dimensioning may be used in both the non-inverting stage and in the inverting stage. In such examples, the inverting stage may comprise a first number of parallel connected transistors, and the non-inverting stage may comprise a second number of parallel connected transistors, the first number being larger than the second number and the ratio of the second number and the first number corresponding to the factor k.

Similarly, the transistor channel length in the above examples may be set by using series-connected transistors. If the factor k is a natural number, the non-inverting stage may comprise one transistor, and the inverting stage may comprise k series-connected transistors of the same type and substantially the same dimensioning. According to a further example, if k is a rational number, series connected transistors may be used both in the non-inverting stage and in the inverting stage. In such examples, the inverting stage may comprise a first number of series connected transistors, and the non-inverting stage may comprise a second number of series connected transistors of the same type and of substantially the same dimensioning, the first number being larger than the second number and the ratio of the second number and the first number corresponding to the factor k.

The above dimensioning examples are merely exemplary and it is to be understood that the dimensioning according to the above examples can be modified. For example, an intermediate configuration between the first example and the second example may be realized.

Further, deviations in the transconductance or voltage amplification between the inverting stage and the non-inverting stage, e.g. due to the body effect or Early effect, parameters of the transistors in the inverting stage may be modified with respect to the parameters of the transistors of the non-inverting stage. For example, the ratio of the transistor channel width to the transistor channel length of the transistors in the inverting stage may be increased, e.g. by increasing the transistor channel width and/or reducing the transistor channel length.

According to some embodiments, parallel-connected transistors and series-connected transistors may be combined so as to adjust both their transistor channel width and the transistor channel length.

Furthermore, although the above-described exemplary circuit structures are based on field-effect transistors of NMOS type, the described concepts can also apply to other transistor types, e.g. field-effect transistors of PMOS type or bipolar transistors. In case of using bipolar transistors, the common-source configuration of the inverting stage corresponds to a common-emitter configuration. Similarly, when using bipolar transistors, the common-gate configuration of the non-inverting stage corresponds to a common-base configuration. In addition, the described and illustrated features of the exemplary circuit structures of FIGS. 1-6 could also be combined with each other as appropriate. For example, the bias circuit of the circuit structure as illustrated in FIG. 3 could be combined with a circuit structure as illustrated in FIG. 4 or 5. Moreover, although the above examples refer to single integrated circuits, other embodiments may use two or more integrated circuits or may be based on discrete components. According to some embodiments, the single-ended to differential converters as described above may be provide with an AC coupling between the inverting stage and the non-inverting stage, which allows for separately setting operating points of the inverting stage and non-inverting stage. According to some embodiments, the bias current of the inverting stage and/or of the non-inverting stage may be controlled as a function of temperature so as to compensate for variations in amplification factor, transconductance, input impedance, and/or output impedance as a function of temperature. According to some embodiments, a cascode structure may be provided at the output of the inverting stage and/or of the non-inverting stage. According to some embodiments, the single-ended to differential converter may be combined with at least one further signal-processing stage, e.g. a mixer stage for frequency translation.

In the above embodiments and examples, noise characteristics and/or intermodulation of the differential output signal may be improved by using a larger bias current of the inverting stage. This is due to the fact that the noise characteristics and the intermodulation of the differential output signal are dominated by the inverting stage, because in first order approximation the noise and intermodulation contribution of the non-inverting stage is visible only as common mode output signal but not as differential output signal. This allows for using more bias current in the inverting stage than in the non-inverting stage to improve noise performance and/or intermodulation performance at a given total current consumption.

Many modifications and other embodiments of the invention will be apparent to one skilled in art to which this invention pertains having the benefit of the teachings presented in the foregoing description and the associated drawings. Therefore, it is to be understood that the invention is not to be limited to the specific embodiments disclosed and that modifications and other embodiments are intended to be included within of the scope of the appended claims. Although specific terms are used herein, there are used in a generic and descriptive sense only and not for purposes of limitation.

What is claimed is:

1. An integrated circuit comprising:
   a single-ended input node;
   a first differential output node;
   a second differential output node;
   an inverting stage coupled between the single-ended input node and the first differential output node, the inverting stage comprising at least one transistor with a first current terminal, a second current terminal, and a control terminal, the first current terminal being coupled to the first differential output node, and the control terminal being coupled to the single-ended input node; and a non-inverting stage coupled between the single-ended input node and the second differential output node, the non-inverting stage comprising at least one transistor with a first current terminal, a second current terminal, and a control terminal, the first current terminal being coupled to the second differential output node, and the second current terminal being coupled to the single-ended input node;

wherein a bias current of the inverting stage is larger than a bias current of the non-inverting stage.

2. The integrated circuit according to claim 1, wherein the at least one transistor of the inverting stage is a field-effect transistor in common-source configuration, and wherein the at least one transistor of the non-inverting stage is a field-effect transistor in common-gate configuration.

3. The integrated circuit according to claim 1, comprising:
a bias circuit configured to set the bias current of the inverting stage and the bias current of the non-inverting stage.

4. The integrated circuit according to claim 3, wherein the bias circuit comprises a bias voltage source coupled to the control terminal of the at least one transistor of the non-inverting stage.

5. The integrated circuit according to claim 3,
wherein the bias circuit comprises an operational amplifier with a non-inverting differential input, an inverting differential input, and a single-ended output,
wherein the non-inverting differential input is coupled to the inverting stage,
wherein the inverting differential input is coupled to the non-inverting stage, and
wherein the single-ended output is coupled to the control terminal of the at least one transistor of the non-inverting stage.

6. The integrated circuit according to claim 3,
wherein the bias circuit comprises a replica circuit of the inverting stage and a replica circuit of the non-inverting stage,
wherein the bias voltage source comprises an operational amplifier with a non-inverting differential input, an inverting differential input, and a single-ended output,
wherein the non-inverting differential input is coupled to the replica circuit of the inverting stage,
wherein the inverting differential input is coupled to the replica circuit of the non-inverting stage, and
wherein the single-ended output is coupled to the control terminal of the at least one transistor of the non-inverting stage.

7. The integrated circuit according to claim 3, wherein the bias circuit comprises a bias current source coupled in series with the at least one transistor of the non-inverting amplifier stage.

8. The integrated circuit according to claim 1, wherein a transistor channel length of the inverting stage is different from a transistor channel length of the non-inverting stage.

9. The integrated circuit according to claim 8,
wherein the inverting stage comprises a first number of transistors connected in series,
wherein the non-inverting stage comprises a second number of transistors connected in series, and
wherein the first number is different from the second number.

10. The integrated circuit according to claim 1, wherein a transistor channel width of the inverting stage is different from a transistor channel width of the non-inverting stage.

11. The integrated circuit according to claim 10,
wherein the inverting stage comprises a first number of transistors connected in parallel,
wherein the non-inverting stage comprises a second number of transistors connected in parallel, and
wherein the first number is different from the second number.

12. The integrated circuit according to claim 1,
wherein the inverting stage comprises at least one resistor coupled to the first differential output node, and
wherein the non-inverting stage comprises at least one resistor coupled to the second differential output node.

13. The integrated circuit according to claim 12, wherein the resistance of the at least one resistor of the non-inverting stage is larger than the resistance of the at least one resistor of the inverting stage.

14. An integrated circuit comprising:
a single-ended input node;
a first differential output node;
a second differential output node;
an inverting stage coupled between the single-ended input node and the first differential output node, the inverting stage comprising at least one transistor with a first current terminal, a second current terminal and a control terminal, the first current terminal being coupled to the first differential output node, and the control terminal being coupled to the single-ended input node; and
a non-inverting stage coupled between the single-ended input node and the second differential output node, the non-inverting stage comprising at least one transistor with a first current terminal, a second current terminal, and a control terminal, the first current terminal being coupled to the second differential output node, and the second current terminal being coupled to the single-ended input node;
wherein a transistor geometry of the inverting stage is different from a transistor geometry of the non-inverting stage;
wherein a transistor channel length of the inverting stage is different from a transistor channel length of the non-inverting stage
wherein the inverting stage comprises a first number of transistors connected in series,
wherein the non-inverting stage comprises a second number of transistors connected in series, and
wherein the first number is different from the second number.

15. The integrated circuit according to claim 14,
wherein the at least one transistor of the inverting stage is a field-effect transistor in common-source configuration and
wherein the at least one transistor of the non-inverting stage is a field-effect transistor in common-gate configuration.

16. A method, comprising:
applying a single-ended input signal to a control terminal of a first transistor,
applying the single-ended input signal to a current output terminal of a second transistor,
tapping a first inverted differential output signal at a current input terminal of the first transistor, tapping a second non-inverted differential output signal at a current input terminal of the second transistor, and setting a bias current of the first transistor to be larger than a bias current of the second transistor.

17. The method according to claim 16,
wherein the first transistor is a field-effect transistor in common-source configuration, and
wherein the second transistor is a field-effect transistor in common-gate configuration.

18. The method according to claim 16, further comprising:
providing the first transistor with a transistor channel length different from the second transistor.

19. The method according to claim 16, further comprising:
providing the first transistor with a transistor channel width different from the second transistor.

20. An electronic device, comprising a single-ended to differential converter, wherein the single-ended to differential converter comprises:
a single-ended input;
a first differential output;
a second differential output;
an inverting stage coupled between the single-ended input and a first differential output, the inverting stage comprising at least one transistor with a first current terminal, a second current terminal, and a control terminal, the first current terminal being coupled to the first differential output, and the control terminal being coupled to the single-ended input; and
a non-inverting stage coupled between the single-ended input and the second differential output, the non-inverting stage comprising at least one transistor with a first current terminal, a second current terminal, and a control terminal, the first current terminal being coupled to the second differential output, the second current terminal being coupled to the single-ended input;
wherein a bias current of the inverting stage is larger than a bias current of the non-inverting stage.

21. The electronic device according to claim 20, wherein a transistor geometry of the inverting stage is different from a transistor geometry of the non-inverting stage.

22. An integrated circuit comprising:
a single-ended input node;
a first differential output node;
a second differential output node;
an inverting stage coupled between the single-ended input node and the first differential output node, the inverting stage comprising at least one transistor with a first current terminal, a second current terminal and a control terminal, the first current terminal being coupled to the first differential output node, and the control terminal being coupled to the single-ended input node; and
a non-inverting stage coupled between the single-ended input node and the second differential output node, the non-inverting stage comprising at least one transistor with a first current terminal, a second current terminal, and a control terminal, the first current terminal being coupled to the second differential output node, and the second current terminal being coupled to the single-ended input node;
wherein a transistor geometry of the inverting stage is different from a transistor geometry of the non-inverting stage;
wherein a transistor channel width of the inverting stage is different from a transistor channel width of the non-inverting stage;
wherein the inverting stage comprises a first number of transistors connected in parallel,
wherein the non-inverting stage comprises a second number of transistors connected in parallel, and
wherein the first number is different from the second number.

* * * * *